(12) United States Patent
Huang et al.

(10) Patent No.: US 10,585,463 B1
(45) Date of Patent: Mar. 10, 2020

(54) LUMINOUS FAN

(71) Applicant: Primax Electronics Ltd., Taipei (TW)

(72) Inventors: Wei-Chiang Huang, Taipei (TW); Wei-Ping Chan, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/364,665

(22) Filed: Mar. 26, 2019

(30) Foreign Application Priority Data

Feb. 15, 2019 (TW) .............................. 108105167 A

(51) Int. Cl.
| | | |
|---|---|---|
| *G06F 1/20* | (2006.01) | |
| *G02B 7/02* | (2006.01) | |
| *F21V 8/00* | (2006.01) | |
| *H05K 1/02* | (2006.01) | |
| *G02B 27/09* | (2006.01) | |
| *F21V 33/00* | (2006.01) | |
| *F04D 25/06* | (2006.01) | |
| *F21Y 115/10* | (2016.01) | |

(52) U.S. Cl.
CPC ............ *G06F 1/20* (2013.01); *F04D 25/0613* (2013.01); *F21V 33/0096* (2013.01); *G02B 6/0095* (2013.01); *G02B 7/021* (2013.01); *G02B 27/0955* (2013.01); *H05K 1/0203* (2013.01); *F21Y 2115/10* (2016.08)

(58) Field of Classification Search
CPC ............. F21V 33/0088; F21V 33/0096; F04D 25/0613; F04D 29/005; G06F 1/20; G06F 1/203; G02B 7/021; G02B 27/0955; H05K 1/0203; F24F 13/078
USPC .............................................. 416/5
See application file for complete search history.

(56) References Cited

U.S. PATENT DOCUMENTS

| | | | |
|---|---|---|---|
| 6,790,003 B1 * | 9/2004 | Hu ...................... | F04D 25/0613 415/118 |
| 7,563,070 B2 * | 7/2009 | Lin ....................... | F04D 29/005 310/73 |
| 10,082,286 B1 * | 9/2018 | Huang ................ | F04D 25/0613 |
| 2016/0369809 A1 * | 12/2016 | Richter ................ | F04D 27/004 |
| 2019/0032912 A1 * | 1/2019 | Xie ....................... | F21V 23/005 |
| 2019/0154250 A1 * | 5/2019 | Chou ................... | F21V 33/0096 |
| 2019/0249862 A1 * | 8/2019 | Fan ........................ | F04D 29/005 |

\* cited by examiner

*Primary Examiner* — Anh T Mai
*Assistant Examiner* — Michael Chiang
(74) *Attorney, Agent, or Firm* — Kirton McConkie; Evan R. Witt

(57) ABSTRACT

A luminous fan includes a supporting mechanism, a main circuit board, a light-guiding impeller and an illumination module. The light-guiding impeller is pivotally coupled to a bracket of the supporting mechanism. The illumination module is disposed within a hub of the light-guiding impeller. After a light beam from a light-emitting element of the illumination module is emitted to a lens assembly, the light beam is refracted by a secondary lens of the lens assembly and transmitted to the light-guiding impeller. Consequently, the light-guiding impeller is illuminated.

10 Claims, 6 Drawing Sheets

LUMINOUS FAN

FIELD OF THE INVENTION

The present invention relates to a fan, and more particularly to a luminous fan.

BACKGROUND OF THE INVENTION

In modern lives, desktop computers have become essential home appliances for small and medium-sized families. Generally, the host of the home computer is equipped with a cooling fan. The cooling fan is used for dissipating the heat from the casing of the host. Since the overheating problem is avoided, the processor, the motherboard or the hard drive in the host is not damaged.

For meeting the requirements or preferences of different users, a computer host with a transparent casing has been introduced into the market. The inner structure or condition within the computer host can be directly observed through the transparent casing. Moreover, the computer host may be further equipped with a luminous fan. When the computer host is turned on, the luminous fan emits a light beam and the luminous fan is operated to remove heat. Consequently, the computer host is operated stably and the appearance of the computer host becomes more modern.

Nowadays, the trends of designing the computer host or the electronic device are toward slimness and miniaturization. For achieving this purpose, the volume of the luminous fan needs to be reduced. Accordingly, the solid state light sources (e.g., light emitting diode) with small size and high luminous efficiency have been widely used in the illumination modules of various luminous fans.

However, the use of the solid state light source still has some drawbacks. For example, since the light beam from the solid state light source travels along a linear trajectory, the diffraction angle is small. As the volume of the luminous fan is reduced, the propagation path of the light beam is shortened and the projection area of the light beam is centralized. Consequently, the overall luminous intensity of the luminous fan is reduced. Since the light beam is centralized, the brightness of the projected location of the light beam is not uniform, and hot spots are generated at the projected location. Due to the generation of the hot spots, the luminous fan cannot provide the uniform luminous efficacy.

For solving the drawbacks of the conventional technologies, the present invention provides a luminous fan for increasing the light utilization efficiency, enhancing the overall luminous intensity and avoiding the generation of the hot spots.

SUMMARY OF THE INVENTION

The present invention provides a luminous fan for increasing the light utilization efficiency, enhancing the overall luminous intensity and avoiding the generation of the hot spots. Consequently, the luminous fan can provide the uniform luminous efficacy.

In accordance with an aspect of the present invention, a luminous fan is provided. The luminous fan includes a supporting mechanism, a main circuit board, a light-guiding impeller and an illumination module. The supporting mechanism includes a bracket. The main circuit board is disposed on the bracket. The light-guiding impeller is pivotally coupled to the bracket, and rotatable relative to the bracket. The light-guiding impeller includes a hub and plural blades. The plural blades are circumferentially disposed on a lateral part of the hub. The illumination module is disposed within the hub, and includes a lens assembly and a light source. The lens assembly includes at least one secondary lens. The light source includes at least one light-emitting element. After a light beam from the at least one light-emitting element is emitted to the lens assembly, the light beam is refracted by the at least one secondary lens and transmitted to the light-guiding impeller, so that the light-guiding impeller is illuminated.

In an embodiment, a ring-shaped inner wall structure is disposed within the hub, and the ring-shaped inner wall structure is circumferentially installed on a top part of the hub. An inner space of the hub is divided into a first accommodation space and a second accommodation space by the ring-shaped inner wall structure.

In an embodiment, the illumination module is disposed within the second accommodation space.

In an embodiment, the luminous fan further includes a rotator assembly and a stator assembly. The rotator assembly and the stator assembly are disposed within the first accommodation space.

In an embodiment, the stator assembly is disposed on the bracket, and the rotator assembly is fixed on a surface of the ring-shaped inner wall structure.

In an embodiment, the lens assembly further includes a light guide part and a support part. The support part is connected with the light guide part.

In an embodiment, the light guide part includes an outer surface and an inner surface, which are opposed to each other. The at least one secondary lens is disposed on the outer surface of the light guide part.

In an embodiment, a position-limiting protrusion structure is protruded from a side of the inner surface of the support part, and a ring-shaped accommodation space is formed between the inner surface of the support part and the position-limiting protrusion structure.

In an embodiment, the light source includes a ring-shaped circuit board and at least one light-emitting element. The at least one light-emitting element is installed on a surface of the ring-shaped circuit board.

In an embodiment, the ring-shaped circuit board is fixed in the ring-shaped accommodation space, and the at least one light-emitting element faces the inner surface of the support part.

In an embodiment, a fixing groove is formed in a periphery region of the bracket. The support part is accommodated within the fixing groove. The position-limiting protrusion structure is in contact with the bracket and an edge of the main circuit board.

In an embodiment, a shaft coupling structure is protruded from the bracket, and the shaft coupling structure is pivotally coupled to the light-guiding impeller.

In an embodiment, the lens assembly has a ring-shaped lens structure.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
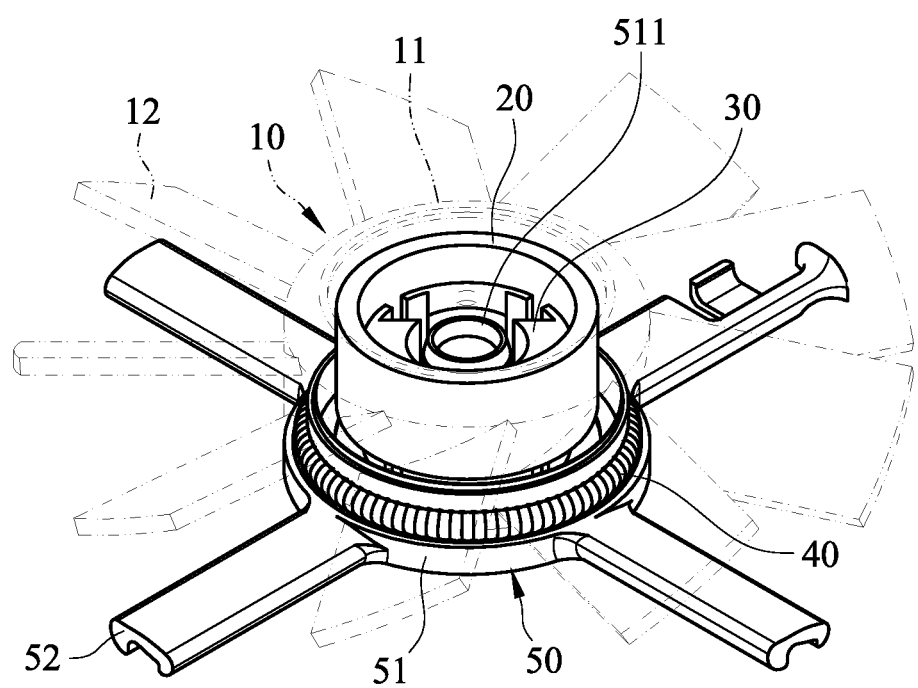
FIG. 1A is a schematic perspective view illustrating a luminous fan according to an embodiment of the present invention.
Figure 1B:
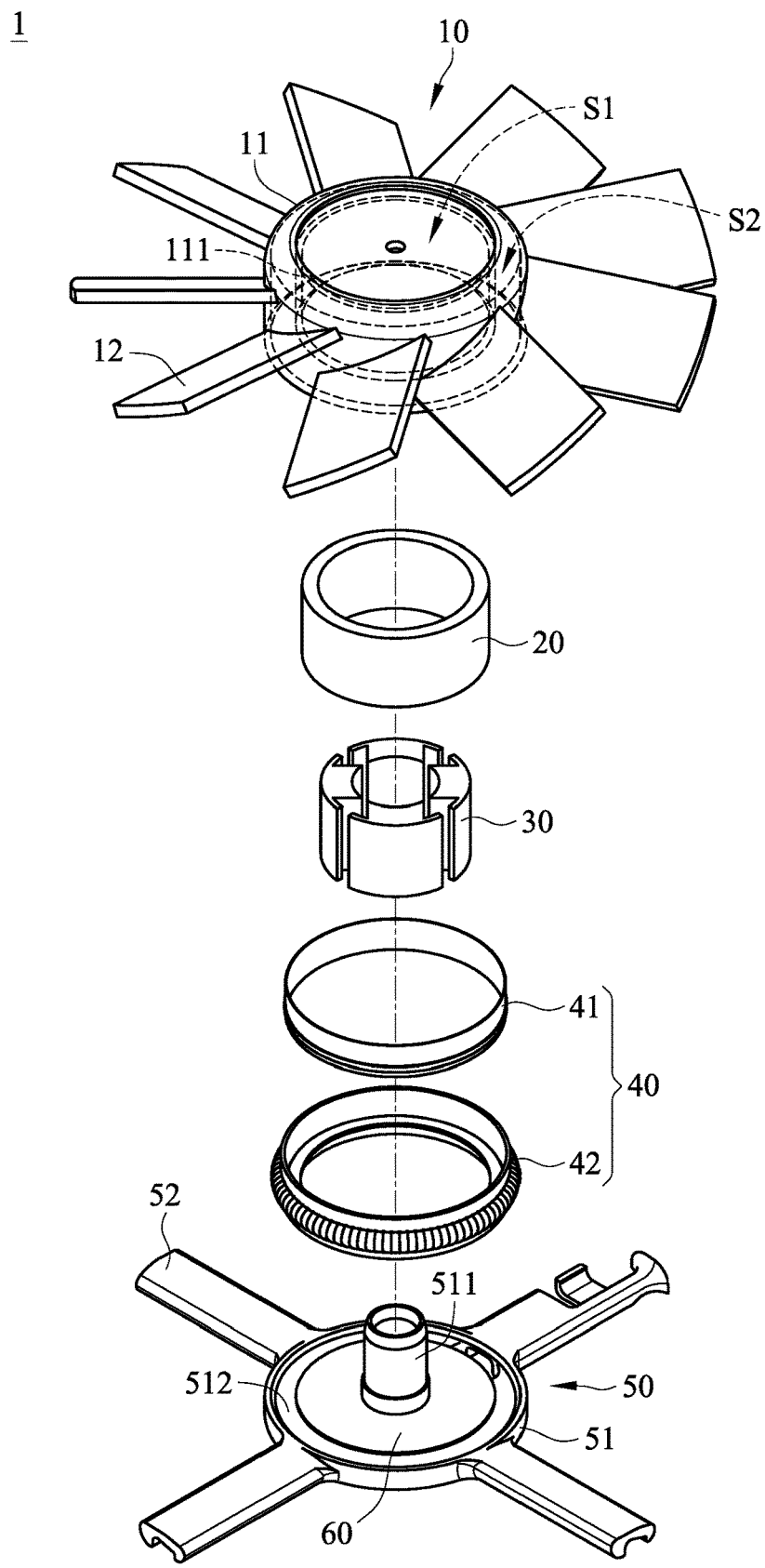
FIG. 1B is a schematic exploded view illustrating the luminous fan according to the embodiment of the present invention.

Please refer to FIGS. 1A and 1B. FIG. 1A is a schematic perspective view illustrating a luminous fan according to an embodiment of the present invention. FIG. 1B is a schematic exploded view illustrating the luminous fan according to the embodiment of the present invention. In this embodiment, the luminous fan 1 comprises a light-guiding impeller 10, a rotator assembly 20, a stator assembly 30, an illumination module 40, a supporting mechanism 50 and a main circuit board 60.

The light-guiding impeller 10 comprises a hub 11 and plural blades 12. The blades 12 are circumferentially disposed on a lateral part of the hub 11. A ring-shaped inner wall structure 111 is circumferentially installed on a top part of the hub 11. By the ring-shaped inner wall structure 111, the inner space of the hub 11 is divided into a first accommodation space 51 and a second accommodation space S2. The second accommodation space S2 is arranged around the first accommodation space 51. A rotation shaft (not shown) is disposed within the first accommodation space S1 and connected with the top part of the hub 11. In an embodiment, the light-guiding impeller 10 is made of light-transmissible/light-guiding material such as polycarbonate (PC) or acrylic resin. In another embodiment, diffusion powder or phosphor powder is added to and mixed with the light-transmissible/light-guiding material during the process of fabricating the light-guiding impeller 10. Consequently, the overall light-guiding efficacy or illuminating efficacy of the light-guiding impeller 10 is increased.

The illumination module 40 comprises a light source 41 and a lens assembly 42. In an embodiment, the lens assembly 42 has a ring-shaped lens structure. The supporting mechanism 50 comprises a bracket 51 and plural ribs 52. The first ends of the ribs 52 are connected with the bracket 51. The second ends of the ribs 52 are connected with a fan frame (not shown). The main circuit board 60 is disposed on the bracket 51. The rotator assembly 20 and the stator assembly 30 are accommodated within the first accommodation space S1. The stator assembly 30 is disposed on the bracket 51 and located over the main circuit board 60. The rotator assembly 20 is fixed on a surface of the ring-shaped inner wall structure 111 and aligned with the stator assembly 30. A fixing groove 512 is formed in a periphery region of the bracket 51. The illumination module 40 is accommodated and fixed in the fixing groove 512. A shaft coupling structure 511 is protruded from a middle region of the bracket 51. The shaft coupling structure 511 is pivotally coupled to a rotation shaft (not shown), which is installed on a top part of the hub 11. Consequently, the light-guiding impeller 10 is rotatable relative to the bracket 51. The main circuit board 60 is used for controlling and powering the illumination module 40 and the stator assembly 30. The main circuit board 60 controls the illumination module 40 to emit the light beam to the hub 11 or the blades 12. Moreover, the main circuit board 60 further controls the power level of the stator assembly 30 in order to adjust the rotating speed of the light-guiding impeller 10.

Figure 1C:
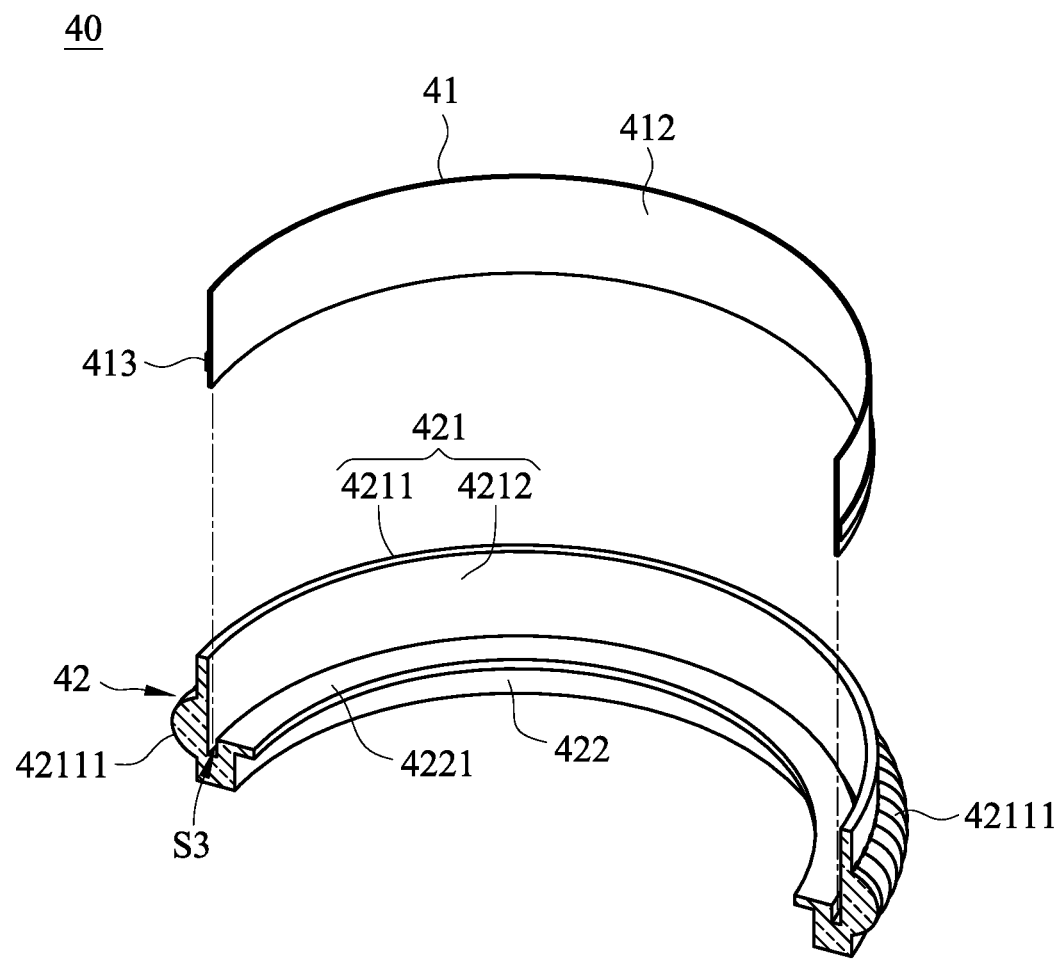
FIG. 1C is a schematic cutaway and exploded view illustrating the illumination module of the luminous fan according to the embodiment of the present invention.

FIG. 1C is a schematic cutaway and exploded view illustrating the illumination module of the luminous fan according to the embodiment of the present invention. The light source 41 comprises a ring-shaped circuit board 412 and a light-emitting element 413. The light-emitting element 413 is installed on a surface of the ring-shaped circuit board 412. The lens assembly 42 comprises a light guide part 421 and a support part 422. The support part 422 is connected with the light guide part 421. The light guide part 421 comprises an outer surface 4211 and an inner surface 4212, which are opposed to each other. One or plural secondary lenses 42111 are formed on the outer surface 4211. A position-limiting protrusion structure 4221 is protruded from a side of the inner surface 4212 of the support part 422. Moreover, a ring-shaped accommodation space S3 is formed between the inner surface 4212 and the position-limiting protrusion structure 4221. In an embodiment, the ring-shaped circuit board 412 is fixed in the ring-shaped accommodation space S3 through an attaching means or a locking means. Moreover, the light-emitting element 413 faces the inner surface 4212. An example of the light-emitting element 413 includes but is not limited to a light emitting diode (LED), an organic light emitting diode (OLED), a quantum dots light emitting diode (QLED) or an electroluminescence (EL) unit.

Figure 2:
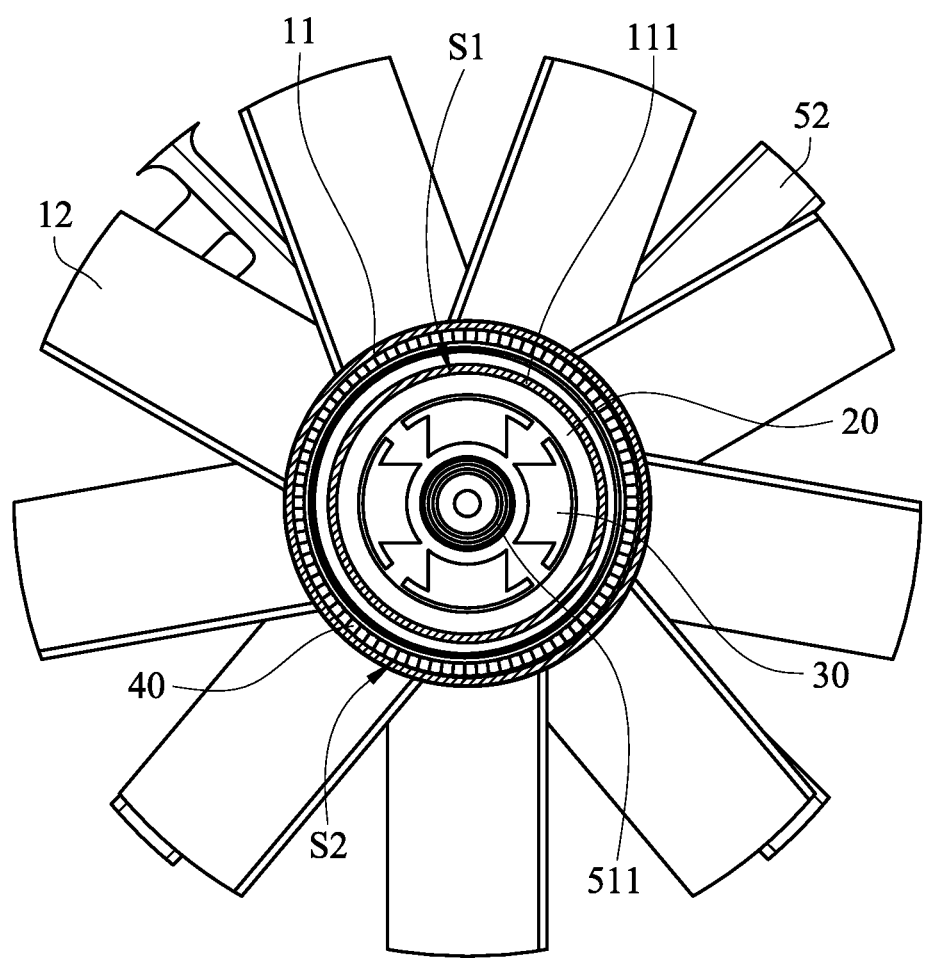
FIG. 2 is schematic perspective view illustrating the luminous fan according to the embodiment of the present invention and taken along a topside viewpoint.
Figure 3:
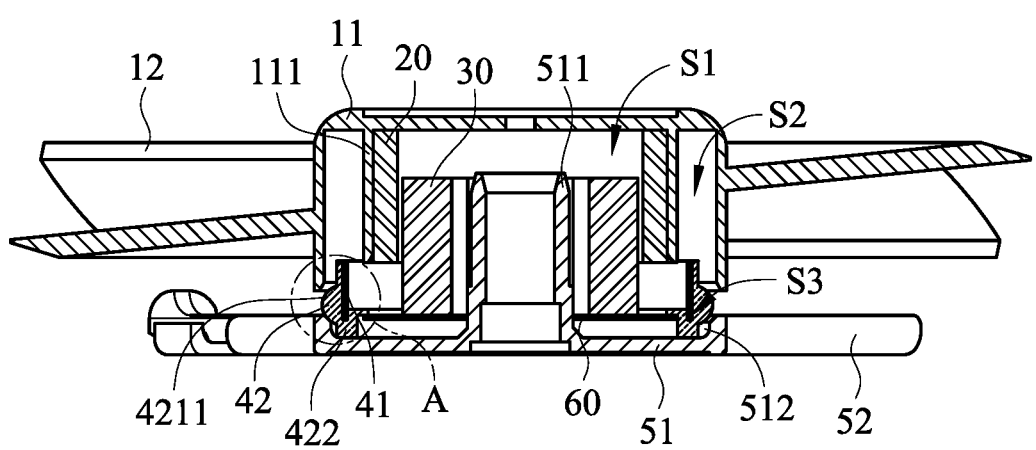
FIG. 3 is a schematic cross-sectional view illustrating the luminous fan according to the embodiment of the present invention.

Please refer to FIGS. 2 and 3. FIG. 2 is schematic perspective view illustrating the luminous fan according to the embodiment of the present invention and taken along a topside viewpoint. FIG. 3 is a schematic cross-sectional view illustrating the luminous fan according to the embodiment of the present invention. The rotator assembly 20 and the stator assembly 30 are disposed within the first accommodation space S1. The shaft coupling structure 511 is disposed within the first accommodation space S1. Moreover, the shaft coupling structure 511 and the hub 11 of the light-guiding impeller 10 are pivotally coupled to each other. The illumination module 40 is disposed within the second accommodation space S2. Moreover, the illumination module 40 is located over the fixing groove 512, which is formed in the periphery region of the bracket 51.

Figure 4:
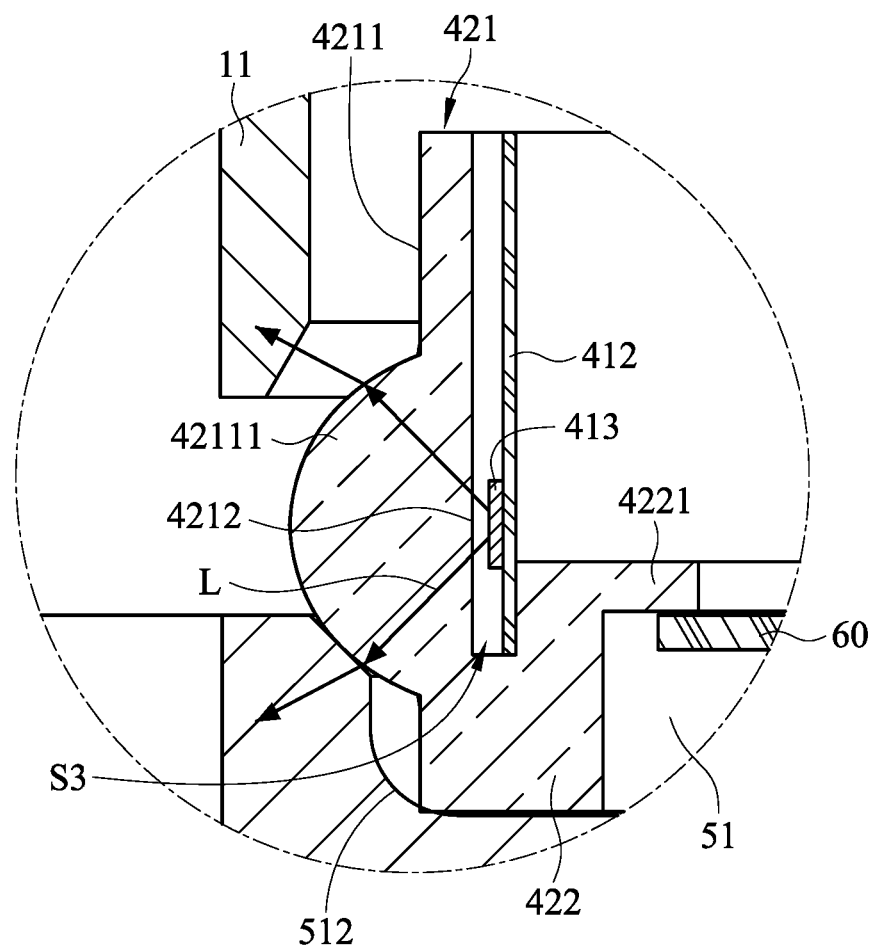
FIG. 4 is a schematic enlarged view of the region A as shown in FIG. 3.

Please refer to FIG. 4. FIG. 4 is a schematic enlarged view of the region A as shown in FIG. 3. As shown in FIG. 4, the fixing groove 512 is formed in the periphery region of the bracket 51, and the support part 422 of the lens assembly 42 is accommodated within the fixing groove 512. The protrusion structure 4221 is protruded from the support part 422 and contacted with the bracket 51 and an edge of the main circuit board 60. Consequently, the lens assembly 42 is fixed. The light-emitting element 413 emits a light beam L toward the inner surface 4212 of the light guide part 421. Then, the light beam L is transmitted to the secondary lens 42111 through the inner surface 4212 of the light guide part 421. After the light beam L is refracted by the secondary lens 42111, the light beam L is projected to the hub 11 or the blades 12. Since the light beam L collected along the vertical axis is refracted by the secondary lens 42111, the luminous intensity of the light-emitting element 413 is enhanced. Moreover, since the refracted light beam L is diffused along the horizontal axis, the possibility of generating the hot spots is effectively reduced and the overall brightness of the light-guiding impeller is more uniform.

In the above embodiment, the illumination module 40 is fixed on the bracket 51. It is noted that the illumination module 40 may be located at any position of the second accommodation space S2. For example, in another embodiment, the lens assembly 42 is disposed on a surface of the inner wall structure 111 and located at the same level with the installation position of the blade 12. Moreover, the secondary lens 42111 is aligned with the blades 12. Consequently, the entire of the light beam L from the illumination module 40 can be received by the blades 12. Under this circumstance, the light loss caused by refraction or reflection will be reduced.

From the above descriptions, the present invention provides the luminous fan. The linear light beam from the light-emitting element is refracted by the secondary lens of the lens assembly. Consequently, the luminous intensity is enhanced. Moreover, the linear light beam from the light-emitting element can be uniformly diffused through the secondary lens of the lens assembly. Consequently, the overall size and volume of the luminous fan are reduced, the possibility of generating the hot spots is effectively reduced, and the brightness of the luminous fan is more uniform. In other words, the luminous fan of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A luminous fan, comprising:
    a supporting mechanism comprising a bracket;
    a main circuit board disposed on the bracket;
    a light-guiding impeller pivotally coupled to the bracket, and is rotatable relative to the bracket, wherein the light-guiding impeller comprises a hub and plural blades, and the plural blades are circumferentially disposed on a lateral part of the hub; and
    an illumination module disposed within the hub, and comprising a lens assembly and a light source, wherein the lens assembly comprises at least one secondary lens, and the light source comprises at least one light-emitting element, wherein the lens assembly further comprises a light guide part and support part, wherein the support part is connected with the light guide part, wherein the light guide part comprises an outer surface and an inner surface, which are opposed to each other, wherein the at least one secondary lens is disposed on the outer surface of the light guide part, wherein a position-limiting protrusion structure is protruded from a side of the inner surface of the support part, and a ring-shaped accommodation space is formed between the inner surface of the support part and the position-limiting protrusion structure,
    wherein after a light beam from the at least one light-emitting element is emitted to the lens assembly, the light beam is refracted by the at least one secondary lens and transmitted to the light-guiding impeller, so that the light-guiding impeller is illuminated.

2. The luminous fan according to claim 1, wherein a ring-shaped inner wall structure is disposed within the hub, and the ring-shaped inner wall structure is circumferentially installed on a top part of the hub, wherein an inner space of the hub is divided into a first accommodation space and a second accommodation space by the ring-shaped inner wall structure.

3. The luminous fan according to claim 2, wherein the illumination module is disposed within the second accommodation space.

4. The luminous fan according to claim 2, wherein the luminous fan further comprises a rotator assembly and a stator assembly, wherein the rotator assembly and the stator assembly are disposed within the first accommodation space.

5. The luminous fan according to claim 4, wherein the stator assembly is disposed on the bracket, and the rotator assembly is fixed on a surface of the ring-shaped inner wall structure.

6. The luminous fan according to claim 1, wherein the light source comprises a ring-shaped circuit board and at least one light-emitting element, wherein the at least one light-emitting element is installed on a surface of the ring-shaped circuit board.

7. The luminous fan according to claim 6, wherein the ring-shaped circuit board is fixed in the ring-shaped accommodation space, and the at least one light-emitting element faces the inner surface of the support part.

8. The luminous fan according to claim 1, wherein a fixing groove is formed in a periphery region of the bracket, wherein the support part is accommodated within the fixing groove, and the position-limiting protrusion structure is in contact with the bracket and an edge of the main circuit board.

9. The luminous fan according to claim 1, wherein a shaft coupling structure is protruded from the bracket, and the shaft coupling structure is pivotally coupled to the light-guiding impeller.

10. The luminous fan according to claim 1, wherein the lens assembly has a ring-shaped lens structure.

* * * * *